United States Patent

Salminen

[11] Patent Number: 5,745,016
[45] Date of Patent: Apr. 28, 1998

[54] METHOD FOR IMPROVING POWER MEASUREMENT IMPLEMENTED WITH A DIRECTIONAL COUPLER AT LOW POWER LEVELS

[75] Inventor: Ari Salminen, Salo, Finland

[73] Assignee: Nokia Mobile Phones Ltd., Salo, Finland

[21] Appl. No.: 644,037

[22] Filed: May 9, 1996

[30] Foreign Application Priority Data

May 10, 1995 [FI] Finland ................... 952268

[51] Int. Cl.⁶ .................................. H03H 7/00
[52] U.S. Cl. ................... 333/17.1; 324/95; 330/279; 330/280; 333/109
[58] Field of Search .............. 333/109, 115, 333/116, 17.1; 324/95; 455/115

[56] References Cited

U.S. PATENT DOCUMENTS

| | | | |
|---|---|---|---|
| 4,392,245 | 7/1983 | Mitama | 455/115 |
| 4,803,440 | 2/1989 | Hotta et al. | 330/145 |
| 5,101,175 | 3/1992 | Vaisanen | 330/279 |
| 5,109,532 | 4/1992 | Petrovic et al. | 455/63 |
| 5,117,202 | 5/1992 | Tsuruoka | 330/279 |
| 5,118,965 | 6/1992 | Vaisanen et al. | 307/261 |
| 5,152,004 | 9/1992 | Vaisanen et al. | 455/68 |
| 5,204,643 | 4/1993 | Verronen | 333/81 R |
| 5,212,815 | 5/1993 | Schumacher | 455/126 |
| 5,214,372 | 5/1993 | Vaisanen et al. | 324/95 |
| 5,214,393 | 5/1993 | Aihara | 330/279 |
| 5,230,091 | 7/1993 | Vaisanen | 455/88 |
| 5,235,295 | 8/1993 | Barbaste et al. | 333/116 X |
| 5,241,694 | 8/1993 | Vaisanen et al. | 455/126 |
| 5,276,917 | 1/1994 | Vanhanen et al. | 455/89 |
| 5,291,150 | 3/1994 | Saarnimo et al. | 330/279 |
| 5,301,367 | 4/1994 | Heinonen | 455/76 |
| 5,304,961 | 4/1994 | Dydyk | 333/112 |
| 5,392,464 | 2/1995 | Pakonen | 455/115 |
| 5,404,585 | 4/1995 | Vimpari et al. | 455/115 |
| 5,432,473 | 7/1995 | Mattila et al. | 330/133 |
| 5,434,537 | 7/1995 | Kukkonen | 330/2 |
| 5,450,620 | 9/1995 | Vaisanen | 455/127 |
| 5,493,255 | 2/1996 | Murtojarvi | 330/296 |

FOREIGN PATENT DOCUMENTS

| | | | |
|---|---|---|---|
| 523718 | 1/1993 | European Pat. Off. | 455/115 |
| 2026706 | 2/1980 | United Kingdom. | |

Primary Examiner—Paul Gensler
Attorney, Agent, or Firm—Perman & Green, LLP

[57] ABSTRACT

The invention relates to a directional coupler arrangement and measurement of radio frequency electric power with a directional coupler arrangement, which arrangement comprises a directional coupler, in which a terminal impedance, a detector element and a control circuit are connected between the end of the second conductor element and the earth potential. The impedance value of the terminal impedance can be altered by means of an electric control signal and said control circuit produces said control signal on the basis of the signal provided by the detector element. When the detected power level is low, the control circuit increases the impedance value of the terminal impedance, whereby the peak voltage of the signal applied to one end of the directional coupler increases and the arrangement yields a measurement result that is larger than ordinary, which improves the accuracy and reliability of the arrangement at low power levels.

15 Claims, 3 Drawing Sheets

METHOD FOR IMPROVING POWER MEASUREMENT IMPLEMENTED WITH A DIRECTIONAL COUPLER AT LOW POWER LEVELS

FIELD OF THE INVENTION

The present invention relates to an improved directional coupler arrangement, which is used to measure radio frequency power, as well as to a method of measuring radio frequency power with an improved directional coupler arrangement.

BACKGROUND OF THE INVENTION

In radio transmitter equipment there is generally a need to measure the power level of the radio frequency signal coming from the output of the amplifier stage and to control the operation of the amplifier stage on the basis of this measurement. A generally used method for measuring radio frequency power is to provide the main line used for power transmission, as shown in FIG. 1, with a directional coupler comprising two elongated conductor elements 1, 2, which are close to each other. The power to be measured is fed through the first conductor element 1, whereby part of it is transferred by electromagnetic coupling to the second element 2. At the opposite end to the input of the power to be measured is the terminal impedance 3 and at the end on the side of the power to be measured there is a detector 4, which detects and measures the power applied to the second element and ordinarily converts it into a voltage signal whose magnitude is proportional to the output power to be measured. Owing to the disposition of terminal impedance 3 and detector 4, the directional coupler is, as its name indicates, directional ie, it expressly measures the power of the signal travelling in the transmission direction.

The signal produced by the directional coupler arrangement is used for the monitoring and control of the power level of the transmitter. The control system ordinarily comprises a differential amplifier 5, by means of which the signal that is produced by the directional coupler arrangement and is proportional to the power level of the transmission signal is compared with reference signal 6. The output of the differential amplifier forms a feedback connection to power amplifier 7 of the transmitter or to some other controllable small signal amplifier or attenuator of the transmission chain and this feedback connection corrects the power level of the transmitter on the basis of the measurement and the reference comparison.

The directional coupler arrangement has a dynamic range that depends on the dimensioning of its parts. At high power levels, the viable measurement range runs out when detector 4 begins to be overdriven. Limiting factors at low power levels are the noise of the detector and changes due to the temperature, which begin to show up as determining factors at the output of detector 4 when the power to be measured falls below the viable measurement range. The efficient measurement range of a typical directional coupler system is approximately 30 to 40 dB and the measurement is the more reliable, the greater the power to be measured is.

In the transmitters of digital data communications systems such as GSM (Groupe Special Mobile) mobile phones, it is advantageous to be able to measure very large power fluctuations. It is particularly important to measure low power levels precisely. The weaker the connection between the elements of a directional coupler, the less loss on the signal path of the signal to be transmitted. The losses must be kept small so that the capacity of the battery of the mobile phone is not consumed needlessly. In conventional mobile phones, the connection of the directional coupler is made weak and the reliability of the measurement of low power levels is improved by means of additional circuits that are connected to the directional coupler or the detector.

It is a known means to use a controllable attenuator element between the directional coupler and the detector. In U.S. Pat. No. 4,392,245 an arrangement is presented in which in between the directional coupler and the detector there is a switch-controlled attenuator means whose action is such that when the switch is closed the coupling factor of the directional coupler is approximately 10 dB weaker than when the switch is open. By means of such an arrangement the measurement range can be extended mainly in the direction of high power levels because at high power levels the overdriving of the detector is prevented by switching on the attenuator means. In the configuration presented in the patent, a control signal must be provided for the attenuator element, and this means extra components and an increase in the power consumption. In U.S. Pat. No. 5,214,393 the same concept is modified by arranging in between the directional coupler and the detector a non-linear circuit whose amplification diminishes at high power levels. This means that the detector must be provided with a compensating circuit that corrects the non-liner characteristics of the signal.

In U.S. Pat. No. 5,117,202, the coupling factor of the directional coupler is altered mechanically by turning a screw that affects the thickness of the microstrip substrate and thereby acts on the coupling factor. This kind of solution naturally has all the drawbacks of mechanical systems, such as the physical wear, jamming and the difficulties caused by manufacturing tolerances.

In a certain state-of-the-art solution, the directional coupler has been supplemented by connecting one element of the directional coupler, as shown in FIG. 2, by its terminal impedance end directly to the power transmission line via capacitor 8 and controllable switch 9. The idea behind the solution is to measure low power levels by means of the capacitor network directly from the transmission line by keeping controllable switch 9 closed. When the power level increases, the control system opens controllable switch 9, whereby the directional coupler functions according to its normal operating principle. The drawbacks of the solution are the need for a separate control signal 10 and the loss of the directability of the directional coupler when controllable switch 9 is closed.

SUMMARY OF THE INVENTION

The objective of the present invention is to disclose a method and circuit by means of which the precision and reliability of power measurement carried out with a directional coupler can be improved, especially at low power levels. The arrangement must maintain the directional property of the directional coupler and it must be simple and low-cost.

The objective is reached by means of the circuit arrangement shown in FIGS. 3a–3c, in which the terminal impedance 12 of one element 2 of the directional coupler is altered electrically. The signal controlling the change is obtained from the output of detector 4, from a reference signal 6 or from a microprocessor that controls the operation of the arrangement (not shown in the Figure).

The improved directional coupler arrangement in accordance with the invention is characterized in that the impedance value of the terminal impedance of the second branch of the directional coupler can be changed electrically by means of a control signal fed to it.

The power measurement method in accordance with the invention is characterized in that the impedance value of the terminal impedance of the second branch of the directional coupler is altered electrically.

It is well known from the theory of the operation of a directional coupler that if the terminal impedance of the second element of a directional coupler is increased, the peak voltage of the signal obtained at the mentioned second element also increases. The invention is based on the insight that the value of the terminal impedance to be controlled can be altered to be inversely proportional to the output voltage coming from the detector. When the power level to be measured diminishes and the output voltage of the detector falls correspondingly, the impedance value of the terminal impedance is increased, thereby increasing the peak voltage of the signal applied to the second element of the directional coupler, whereby the detector gives a larger signal than if the terminal impedance were constant. At low power levels this improves the accuracy and reliability of the measurement because the ratio of the voltage obtained from the detector to the noise and other interference increases. When the power level in the power transmission line rises, the terminal impedance and via it the peak voltage of the signal applied to the second element of the directional coupler are decreased, which prevents the detector from being overdriven.

Without the change in the terminal impedance at low power levels in accordance with the invention, the directional coupler would be an essentially linear arrangement, ie, the level of the signal coming from the detector would be directly proportional to the output power to be measured. Because the increasing of the terminal impedance in accordance with the invention and via it the increasing of the voltage signal applied to the second element of the directional coupler increase the value of the voltage coming from the detector by a greater amount at low power levels than at high power levels, the arrangement becomes non-linear. This must be taken into account in designing the control loop which on the basis of the directional coupler measurement controls the operation of the power amplifier of the transmitter.

In a preferred embodiment of the network in accordance with the invention, external control signals are not needed because the signal controlling the terminal impedance is obtained directly from the output of the detector. Extra network connections that might cause losses need not be made to the power transmission line. The preferred embodiments presented below show that the feedback circuit and the controllable terminal impedance can be easily implemented with conventional components. The additional components do not increase the current consumption of the power measuring arrangement significantly.

BRIEF DESCRIPTION OF THE DRAWINGS

The invention is discussed in greater detail in the following by describing two preferred embodiments. In the discussion reference is made to the accompanying drawings, in which.

DETAILED DESCRIPTION OF THE INVENTION

Figure 1:
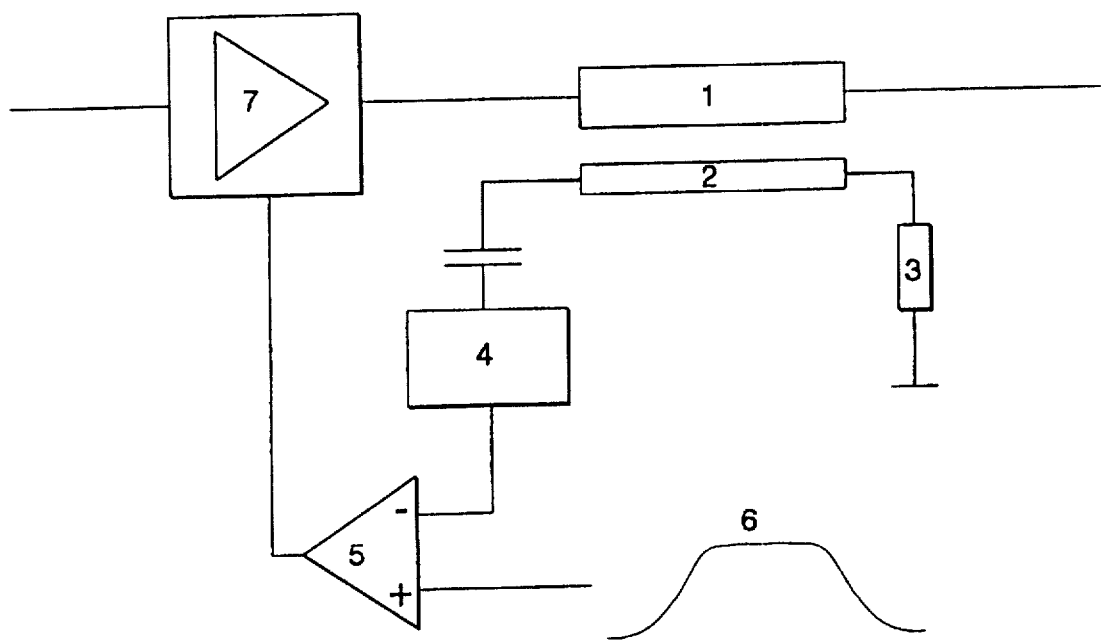
FIG. 1 shows the general principle of a well-known directional coupler.
Figure 2:
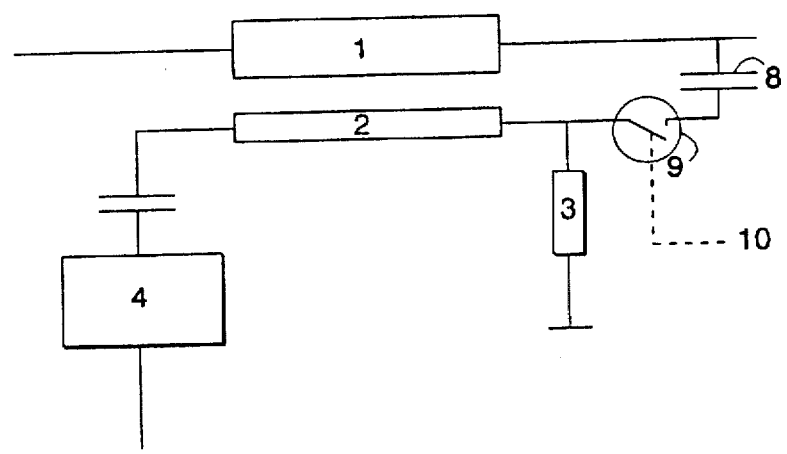
FIG. 2 shows a certain known arrangement for improving the measurement accuracy of a directional coupler at low power levels.

FIGS. 1 and 2 were discussed above in connection with the description of the state of the art and accordingly in the following description of the invention reference will be made mainly to FIGS. 3a–5. In the figures the same reference numbers are used for corresponding parts.

Figure 3A:
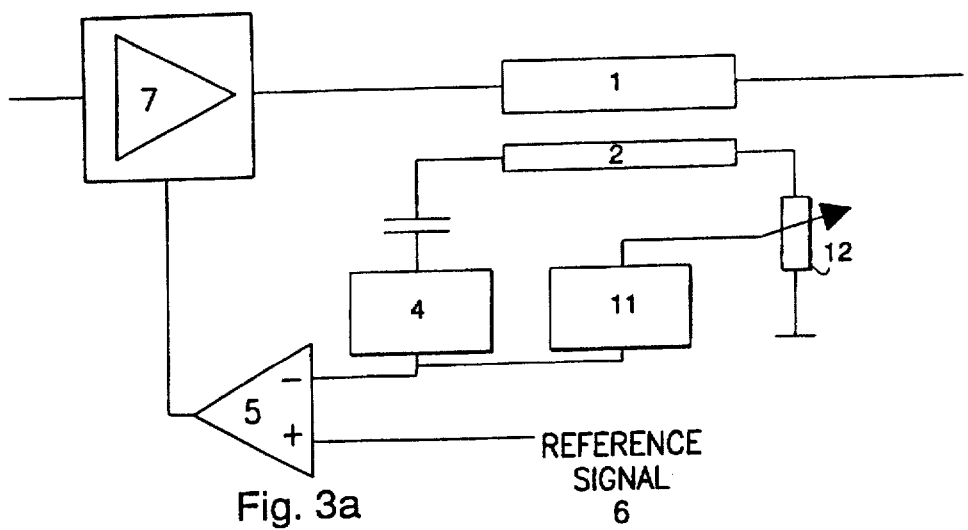
FIG. 3a shows a certain circuit arrangement in accordance with the present invention.

FIG. 3a shows a directional coupler in which RF power coming from the transmitter travels along a power transmission line and via the first element 1 from left to right. At the right end of the second element 2 of the directional coupler, ie, at the end opposite the input of the power to be measured, there is a controllable terminal impedance 12 and at the end on the side of the input of the power to be measured there is a detector 4 which detects and measures the power connected to the second element 2 and converts it into a voltage signal the magnitude of which is proportional to the transmission power to be measured. Connected to the output of detector 4 is a feedback circuit 11, which controls the controllable terminal impedance 12 in such a way that when the output voltage of detector 4 increases, feedback circuit 11 reduces the value of terminal impedance 12 and vice versa.

Figure 3B:
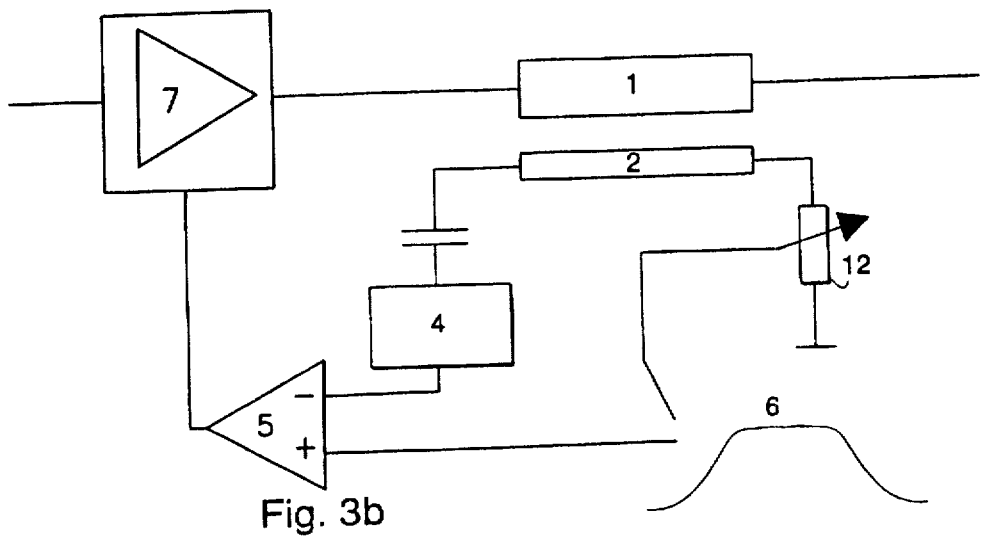
FIG. 3b shows a second circuit arrangement in accordance with the present invention.

FIG. 3b otherwise shows a network configuration of the previous kind but the impedance value of the controllable terminal impedance 12 is changed by means of reference signal 6, whose main use in a directional coupler arrangement is its comparison with the output voltage of detector 4 in order to produce, by means of a differential amplifier 5, a signal that controls the regulation of the transmission power. The principle of the comparison is similar to that shown in FIG. 1, which is a state-of-the-art arrangement, and it is not essential from the standpoint of the present invention. The essential point in this embodiment is nevertheless the use of a reference signal 6, which is an integral part of the arrangement, which means that other external control signals are not needed.

Figure 3C:
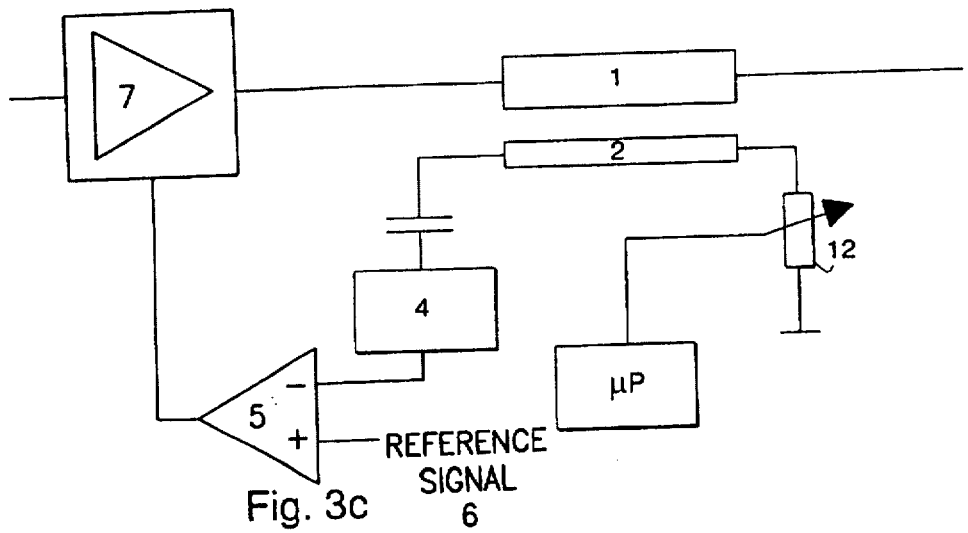
FIG. 3c shows a third circuit arrangement in accordance with the present invention.

FIG. 3c shows a circuit arrangement that is otherwise like the above one but the impedance value of the controllable terminal impedance 12 is altered by means of a signal that is produced by microprocessor μP, which controls the operation of the entire system.

Figure 4:
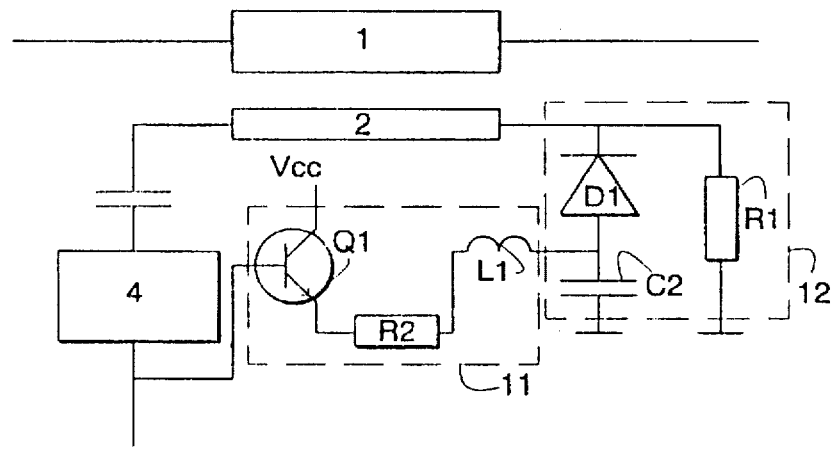
FIG. 4 shows a preferred embodiment of the present invention.

FIG. 4 shows a preferred embodiment of a circuit arrangement according to FIG. 3a. In it the controllable terminal impedance 12 is composed of a circuit arrangement in which the series connection formed by resistor R1 and PIN diode D1 and capacitor C2 is connected in parallel between the end of the second element 2 of the directional coupler and the earth potential. PIN diode D1 and capacitor C2 are connected in such a way that the cathode of PIN diode D1 is connected to the end of the directional coupling element and its anode is connected via capacitor C2 to the earth potential. A feedback circuit 11 is formed by NPN transistor Q1, resistor R2 and choke L1. The collector of transistor Q1 is connected to the positive voltage Vcc, its base is connected to the output of the detector and its emitter is connected via resistor R2 and choke L1 to the anode of PIN diode D1, ie, between PIN diode D1 and capacitor C2.

In the circuit arrangement in FIG. 4, resistor R1, PIN diode D1 and capacitor C2 are dimensioned in such a way that when PIN diode D1 is forward biased, the impedance of the signal path formed by it and capacitor C2 is smaller than the impedance of the signal path formed by resistor R1. When PIN diode D1 is not forward biased, the impedance of the signal path formed by it and capacitor C2 is correspondingly greater than the impedance of the signal path formed by resistor R1. The biasing takes place by means of transistor Q1, resistor R2 and choke L1.

When the output voltage of detector 4 is large, transistor Q1 is in the conducting state and PIN diode D1 is forward biased. In this case the impedance of the signal path formed by it and capacitor C2 determines for the most part the value of terminal impedance 12 of the second element of the directional coupler. When the output voltage of detector 4 is small, transistor Q1 is not in the conducting state and PIN diode D1 is not forward biased, which means that the value of the terminal impedance is mainly determined by resistor R1. In accordance with the above-discussed dimensioning, the value of terminal impedance 12 is greater in the latter situation, whereby the peak voltage applied to the second element 2 of the directional coupler and thus also the voltage obtained from detector 4 is greater and the arrangement amplifies a weak measurement signal in accordance with the objective of the invention.

Figure 5:
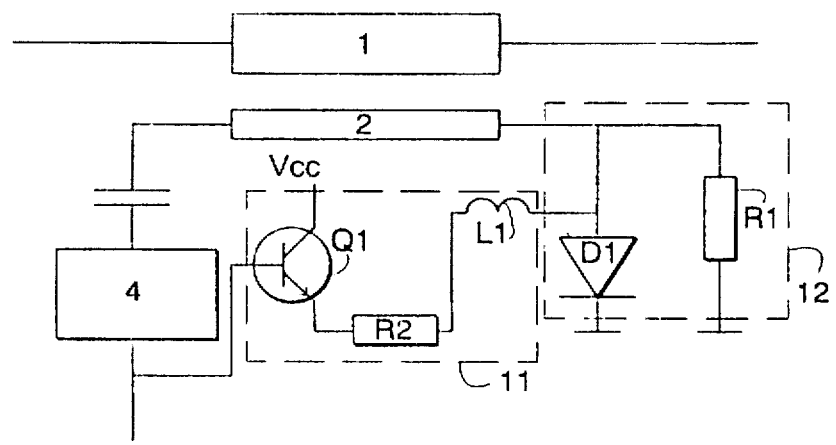
FIG. 5 shows a second preferred embodiment of the present invention.

FIG. 5 presents a second preferred embodiment of the circuit arrangement according to FIG. 3a. In it controllable terminal impedance 12 is composed of a network in which resistor R1 and PIN diode D1 are connected in parallel between the end of the second element 2 of the directional coupler and the earth potential. PIN diode D1 is connected in such a way that its anode is connected to the end of the directional coupling element and its cathode is connected to the earth potential. A feedback circuit 11 is formed by NPN transistor Q1, resistor R2 and choke L1. The collector of transistor Q1 is connected to the positive voltage Vcc, its base is connected to the output of the detector and its emitter is connected via resistor R2 and choke L1 to the anode of PIN diode D1.

In the network in FIG. 5, resistor R1 and PIN diode D1 are dimensioned in such a way that when PIN diode D1 is forward biased, the impedance of the signal path it forms is smaller than the impedance of the signal path formed by resistor R1. When PIN diode D1 is not forward biased, the impedance of the signal path it forms is correspondingly greater than the impedance of the signal path formed by resistor R1. The biasing takes place by means of transistor Q1, resistor R1 and choke L1.

When the output voltage of detector 4 is large, transistor Q1 is in the conducting state and PIN diode D1 is forward biased. In this case, the impedance of the signal path formed by it determines for the most part the value of the terminal impedance of the second element of the directional coupler. When the output voltage of detector 4 is small, transistor Q1 is not in the conducting state and PIN diode D1 is not forward biased, whereby the value of the terminal impedance is mainly determined by resistor R1. In accordance with the above-discussed dimensioning, the value of terminal impedance 12 is greater in the latter situation, in which case the peak voltage applied to the second element 2 of the directional coupler and thus also the voltage obtained from detector 4 is greater and the arrangement amplifies a weak measurement signal in accordance with the objective of the invention.

In the embodiments described the controllable terminal impedance 12 that is used is a parallel connection, one branch of which comprises a PIN diode and the other branch a resistor. Control of the impedance in this case takes place by biasing the PIN diode in the forward mode, not at all or in the reverse mode. This arrangement is particularly advantageous because the biasing can be accomplished with a simple circuit whose state is determined by the output voltage of the detector. The idea behind the present invention is not, however, confined to the embodiments described, but instead the controllable impedance can be implemented also in other ways known to one versed in the art. In the implementation of feedback circuit 11 too, there are, in addition to the embodiments described, several possibilities which in and of themselves are obvious to one versed in the art.

The method and circuit according to the invention are simple and the manufacturing costs of the circuit are small. It can be applied in all radio frequency applications in which the intention is to measure the power travelling in the transmission line particularly at low power levels. An application that suggests itself is a mobile phone that is intended for use in a digital data transfer network, where measurement of the transmission power of the mobile telephone is required to have a low loss capability and a particularly large dynamic range.

I claim:

1. A directional coupler arrangement for measuring radio frequency power, which directional coupler arrangement comprises a directional coupler comprising a first conductor element (1) and a second conductor element (2), both of which comprise a first end and a second end, a detector element (4) for detecting a level of power coupled from the first conductor element (1) to the second conductor element (2) and for providing an output signal as a response to said power level, which detector element comprises an input port and an output port and whose input port is connected to the first end of the second element (2), and a terminal impedance (12), which is connected between the second end of the second conductor element (2) and an earth potential, characterized in that the impedance value of said terminal impedance (12) is altered electrically by means of a control signal fed to it.

2. A directional coupler arrangement according to claim 1, characterized in that said terminal impedance (12) comprises two parallel connected branches, the impedance of said first branch is alterable to be made smaller or larger than the impedance of the second branch by means of said control signal.

3. A directional coupler arrangement according to claim 2, characterized in that said first branch comprises a PIN diode (D1) whose bias voltage is said control signal.

4. A directional coupler arrangement according to claim 3, characterized in that said control circuit comprises a transistor (Q1) for controlling the bias voltage of the PIN diode (D1).

5. A directional coupler arrangement according to claim 4, characterized in that said transistor (Q1) is a bipolar transistor having a base connected to the output port of said detector element (4), a collector connected to a positive potential (Vcc) and an emitter connected to an anode of said PIN diode (D1).

6. A directional coupler arrangement according to claim 3, characterized in that said directional coupler arrangement further comprises a capacitor (C2), wherein a cathode of said PIN diode (D1) is connected to the second end of the second element (2) of the directional coupler and an anode of said PIN diode (D1) is connected via said capacitor (C2) to the earth potential.

7. A directional coupler arrangement according to claim 3, characterized in that an anode of said PIN diode (D1) is connected to the second end of the second element (2) of the directional coupler and a cathode of said PIN diode (D1) is connected to the earth potential.

8. A directional coupler arrangement for measuring radio frequency power, which directional coupler arrangement comprises a directional coupler comprising a first conductor element (1) and a second conductor element (2), both of which comprise a first end and a second end, a detector element (4) for detecting a level of power coupled from the first conductor element (1) to the second conductor element (2) and for providing an output signal as a response to said power level, which detector element comprises an input port and an output port and whose input port is connected to the first end of the second element (2), and a terminal impedance (12), which is connected between the second end of the second conductor element (2) and an earth potential, characterized in that the impedance value of said terminal impedance (12) is altered electrically by means of a control signal fed to it, and further characterized in that said directional coupler arrangement comprises a control circuit (11) between said detector element (4) and said terminal impedance (12) for forming said control signal on the basis of the output signal of the detector element.

9. A method for measuring the radio frequency power of a transmitter with a directional coupler arrangement, wherein the directional coupler arrangement comprises a directional coupler having a first conductor element and a second conductor element, the first conductor element being disposed within a transmission path of the transmitter, the second conductor element having a first end and a second end, the first end of the second conductor element being electrically connected to the transmitter and defining a first branch, the second end of the second conductor being electrically terminated at an earth potential and defining a second branch, the method comprising the steps of:

detecting a power level at the first branch using a detector disposed between the first end of the second conductor and the transmitter;

forming an output signal based upon the detected power level of the first branch; and electrically altering an impedance value of a terminal impedance of the directional coupler measured at the second end of the second conductor.

10. A method according to claim 9, further comprising the steps of:

forming a control signal from the output signal which is based upon the detected power level of the first branch; and varying the control signal in response to changes in the output signal, wherein the control signal electrically alters the impedance value of the terminal impedance of the directional coupler.

11. A method according to claim 10, wherein the step of varying the control signal in response to changes in the output signal reduces the impedance value of the terminal impedance of the directional coupler when the value of the output signal increases, and increases the impedance value of the terminal impedance of the directional coupler when the value of the output signal diminishes.

12. A method according to claim 10, wherein the terminal impedance of the directional coupler is driven by a PIN diode (D1) disposed on the second branch between the second end of the second conductor and the earth potential, wherein the step of varying the control signal in response to chances in the output signal forward biases the PIN diode (D1) when the value of the output signal increases, and when the value of said output signal diminishes, the forward biasing of the PIN diode (D1) is reduced towards zero biasing.

13. A method according to claim 10, wherein the terminal impedance of the directional coupler is driven by a PIN diode (D1) disposed on the second branch between the second end of the second conductor and the earth potential, wherein the step of varying the control signal in response to changes in the output signal forward biases the PIN diode (D1) when the value of the output signal increases, and when the value of the output signal diminishes, the PIN diode (D1) is reverse biased.

14. A method according to claim 9, wherein the directional coupler arrangement includes a reference signal for controlling the power level, wherein the step of electrically altering the impedance value of the terminal impedance is performed by the reference signal.

15. A method according to claim 9, wherein the step of electrically altering the impedance value of the terminal impedance of the directional coupler is performed by an electrical signal formed by a processor that controls an operation of the directional coupler arrangement.

* * * * *